(12) United States Patent
Govoreanu et al.

(10) Patent No.: US 8,021,948 B2
(45) Date of Patent: Sep. 20, 2011

(54) SCALABLE INTERPOLY DIELECTRIC STACKS WITH IMPROVED IMMUNITY TO PROGRAM SATURATION

(75) Inventors: Bogdan Govoreanu, Hulshout (BE); Stefan De Gendt, Wijnegem (BE); Sven Van Elshocht, Heverlee (BE); Tom Schram, Rixensart (BE)

(73) Assignee: IMEC, Leuven (BE)

( * ) Notice: Subject to any disclaimer, the term of this patent is extended or adjusted under 35 U.S.C. 154(b) by 370 days.

(21) Appl. No.: 12/338,015

(22) Filed: Dec. 18, 2008

(65) Prior Publication Data
US 2009/0166715 A1    Jul. 2, 2009

Related U.S. Application Data

(60) Provisional application No. 61/016,862, filed on Dec. 27, 2007.

(30) Foreign Application Priority Data

Mar. 20, 2008  (EP) ..................... 08153100

(51) Int. Cl.
*H01L 29/72* (2006.01)
(52) U.S. Cl. ........ 438/287; 438/211; 438/240; 438/254; 438/257; 438/261; 438/264; 438/288; 438/690
(58) Field of Classification Search .................. 438/211, 438/240, 254, 257, 261, 264, 287, 288, 690
See application file for complete search history.

(56) References Cited

U.S. PATENT DOCUMENTS

| 7,449,385 B2 * | 11/2008 | Rotondaro et al. ........... 438/287 |
| 2005/0093054 A1 | 5/2005 | Jung |
| 2007/0045718 A1 | 3/2007 | Bhattacharyya |
| 2007/0052011 A1 | 3/2007 | Bhattacharyya |
| 2007/0215929 A1 | 9/2007 | Yasuda |

FOREIGN PATENT DOCUMENTS
EP     1253646     10/2002

OTHER PUBLICATIONS

European Search Report from Related Application No. EP 08 15 3100.6, dated Aug. 29, 2008.

* cited by examiner

*Primary Examiner* — Edward Wojciechowicz
(74) *Attorney, Agent, or Firm* — McDonnell Boehnen Hulbert & Berghoff LLP (57) ABSTRACT

A method for manufacturing a non-volatile memory device is described. The method comprises growing a layer in a siliconoxide consuming material, e.g. DyScO, on top of the upper layer of the layer where charge is stored. A non-volatile memory device is also described. In the non-volatile memory device, the interpoly/blocking dielectric comprises a layer in a siliconoxide consuming material, e.g. DyScO, on top of the upper layer of the layer where charge is stored, the siliconoxide consuming material having consumed at least part of the upper layer.

8 Claims, 12 Drawing Sheets

SCALABLE INTERPOLY DIELECTRIC STACKS WITH IMPROVED IMMUNITY TO PROGRAM SATURATION

RELATED APPLICATIONS

This application claims priority under 35 U.S.C. §119(e) to U.S. Provisional Patent Application Ser. No. 61/016,862, filed on Dec. 27, 2007 and under 35 U.S.C. §119(b) to European Patent Application EP 08153100.6, filed on Mar. 20, 2008, the full disclosures of which are incorporated herein by reference.

FIELD

The present disclosure relates generally to memory devices, and more particularly, relates to a non-volatile memory device.

BACKGROUND

In a floating gate non-volatile memory cell, where typically polysilicon is used as charge storage medium, a dielectric is known as an interpoly dielectric (IPD). The conventional interpoly dielectrics of non-volatile memory cells are based on SiO2/Si3N4/SiO2 (ONO) stacks which may lack scalability to below 10 nm equivalent oxide thickness (EOT). When a high-k dielectric material is used in an interpoly dielectric of a floating gate memory, care may need to be taken to avoid forming a lower-k material (e.g., SiO2) in between the layer of high-k material and the silicon floating gate. This bottom layer of lower-k material has a dielectric constant which is lower than that of the upper layer of high-k material. The combination of a lower-k/higher-k layer stack may unintentionally create a so-called Variot effect, an effect discussed in EP-A-1253646.

When present, the Variot effect may reduce the ability of a non-volatile memory to achieve a sufficiently large shift in threshold voltage, Vt, level when injecting carriers into the charge storage gate during programming, due to parasitic charge leakage through the interpoly dielectric. As a consequence, the threshold Vt-window may not be sufficient to ensure multilevel cell operation.

SUMMARY

The present disclosure describes a manufacturing process and resulting non-volatile memory device with which the insulating properties of the dielectric between the charge storage layer and the control gate can be improved.

Embodiments of the present disclosure are applicable to non-volatile memory devices of the floating gate type as well as the charge trapping type in which a siliconoxide containing layer is formed on top of the charge storage location during the manufacturing process. Hence, as used herein, the "charge storage layer" can refer to a conductive floating gate or a charge trapping layer, i.e. a layer with discrete charge storage sites. The siliconoxide containing layer may be present intentionally or unintentionally (e.g., as a result of unavoidable process conditions). The second dielectric on top of the charge storage medium can be the interpoly dielectric (in the case of a floating gate) or the blocking dielectric (in the case of a charge trapping layer).

Embodiments of the present disclosure provide a cost efficient manufacturing process and resulting non-volatile memory device with which the insulating properties of the dielectric between the charge storage layer and the control gate can be improved. In embodiments, this is achieved by using a SiO— consuming material, preferably dysprosium scandate or another material containing a rare earth material, as the material for the second dielectric or at least a layer at the interface on top of the charge storage layer, and subjecting the non-volatile memory device to a post deposition thermal treatment in which a predetermined thermal budget is applied, such that the SiO— consuming material consumes at least part of the SiO— at the interface. The application of the thermal budget means that the device is subjected to a predetermined temperature for a predetermined time period, sufficient for activating the consuming property of the SiO— consuming material. So the use of a SiO— consuming material has the property that any interfacial SiO— containing layer at the top side of the charge storage layer is at least partly consumed in the finished device. This reduces or avoids the parasitic Variot effect in the dielectric of the obtained non-volatile memory device and can ensure a larger high-Vt window and scalability of the device.

As used herein, dysprosium scandate and the abbreviation DyScO are used to refer to the material with the stoichiometric formula DyScO3 as well as any non-stoichometric variant, i.e. any possible composition of Dy, Sc and O, e.g. by combining dysprosium oxide and scandium oxide in variable ratios.

In the method according to the present disclosure, the post deposition thermal treatment is preferably performed at a temperature higher than (about) 600° C., preferably comprised between (about) 600° C. and (about) 1200° C., more preferably comprised between (about) 600° C. and (about) 1000° C. More preferably, said treatment is performed at a temperature higher than (about) 800° C., preferably comprised between (about) 800° C. and (about) 1200° C., more preferably comprised between (about) 800° C. and (about) 1000° C.

In further embodiments a low-k layer can be formed between the DyScO layer, which is a high-k layer (i.e., $k > k_{SiO2}$), and the control gate. The second dielectric may further comprise a second DyScO layer on top of the low-k layer, which may result in a substantially SiO-free non-volatile memory device. The control gate is preferably made in a high workfunction metal to allow for independently controlling the Fermi level at the top dielectric/control gate interface and the high-k layers can be nitrided.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 6 (a) shows the physical thickness variation of as deposited dielectrics upon anneal at different temperatures;

FIG. 6 (b) shows the thickness variation of as deposited ALD La2O3 upon different anneal steps approximately from 600° C. to 1000° C.;

DETAILED DESCRIPTION

The present disclosure will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Embodiments of the present disclosure are applicable to non-volatile memory devices of the floating gate type as well as the charge trapping type in which a siliconoxide (SiO—) containing layer is formed on top of the charge storage location during the manufacturing process. The siliconoxide containing layer may be present intentionally or unintentionally (e.g., as a result of unavoidable process conditions). Examples of non-volatile memory devices according to the present disclosure are devices with a polysilicon floating gate, devices with a silicon nitride charge trapping layer, or other layers containing silicon such as silicon nanocrystals or high-k silicon-based charge trapping layers.

Figure 1:
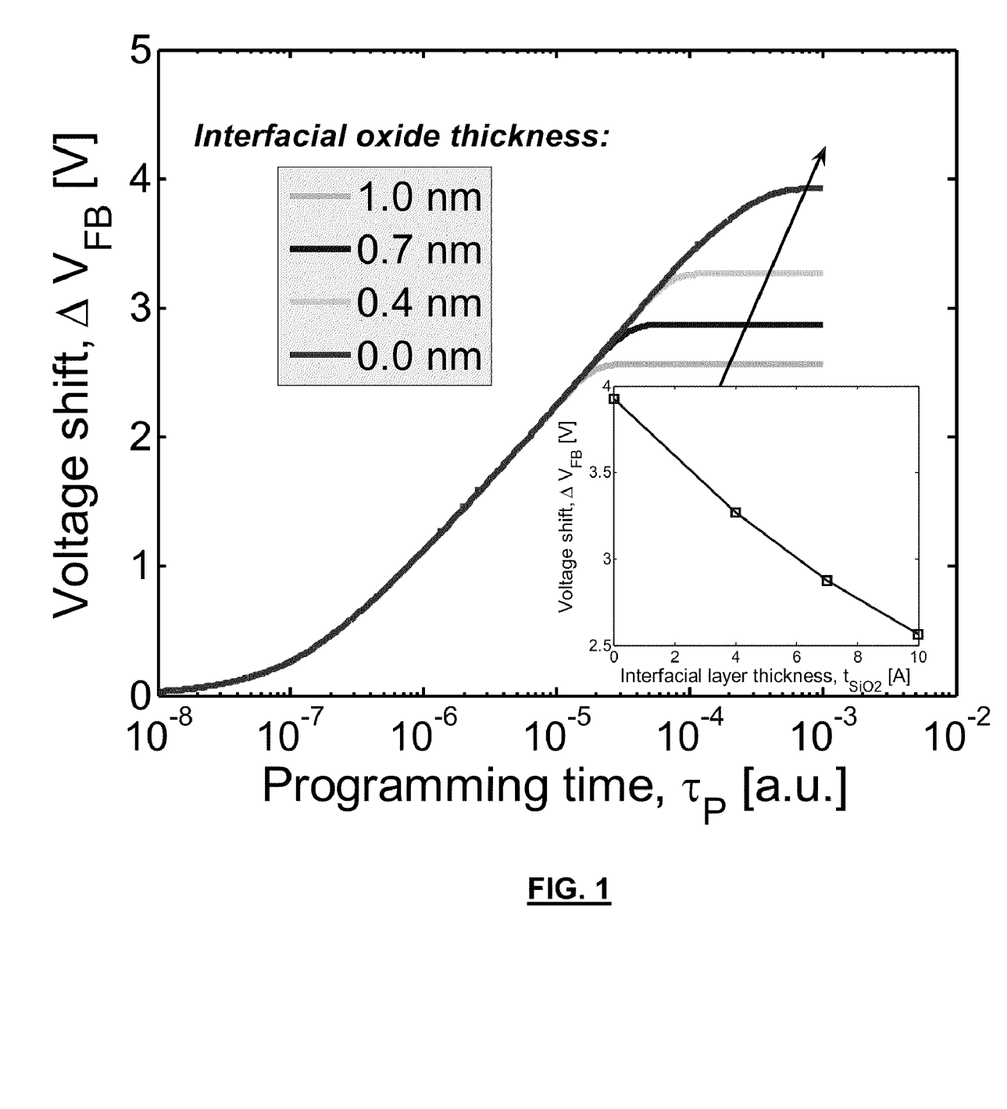
FIG. 1 shows increase of the high-Vt window with decreasing interfacial layer thickness.
Figure 2:
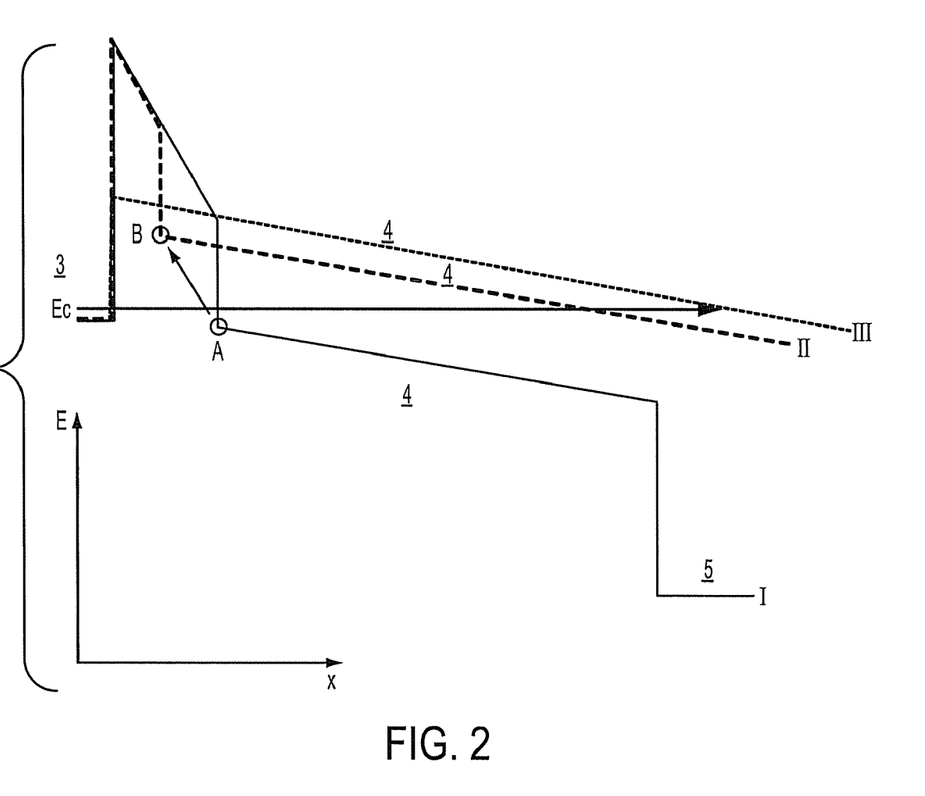
FIG. 2 explains this by the fact that a parasitic VARIOT effect is suppressed more and more with reducing the interfacial oxide thickness.

Embodiments of the present disclosure exploit the unique material properties that high-k dielectrics such as DyScO, have following the post-deposition thermal treatment. More specifically, provided the thermal budget is high enough, a SiO-based interfacial layer situated between the underlying charge storage layer and the high-k itself can be "consumed", leading to the formation of a silicate layer, e.g. a DyScSiO (Dy-, Sc-silicate) layer, at the interface. FIGS. 1 and 2 show theoretical results and provide additional explanations in support of the above. In particular, FIG. 1 shows how the high-Vt window increases as the thickness of the SiO-interfacial layer decreases, indicative of the fact that more injected charge remains in the charge storage layer. These results are obtained assuming identical electrical equivalent oxide thicknesses (EOTs) for interpoly dielectrics (IPDs) consisting of one thin lower-k dielectric layer, SiO in this case, and a high-k dielectric layer. When the thickness of the thin interfacial layer is reduced from 1 nm to 0 nm (no interfacial layer is present and the IPD consists merely of a single high-k layer), the maximum level of the Vt that can be obtained during programming increases. The inset shows the maximum Vt corresponding to various interfacial layer thickness, whereby the shift in threshold voltage (V) for given programming conditions decreases with increasing interfacial layer thickness.

FIG. 2 shows the band diagrams of the charge storage layer 3, the interpoly dielectric 4 and the control gate electrode 5 for different thicknesses of the lower-k interfacial layer of the interpoly dielectric (IPD) 4 (I, II, III). In FIG. 2, the continuous line I shows the conventional situation over the IPD 4 during programming, with the energy barrier being undesirably reduced by the presence of the lower-k interfacial SiO (left part of the IPD 4). Here the excess electrons stored on the floating gate while programming will be injected directly into the conduction band of the high-k layer. This is why excess electrons stored on the floating gate 3 need only tunnel through the lower-k portion of the IPD 4 to reach the control gate 5. The dashed line II shows the situation where the thickness of the lower-k interfacial layer is reduced. The energy barrier shown by the high-k layer of the stack at programming condition increases, due to the thinner lower-k layer over which a smaller potential drops and the electrons stored on the floating gate cannot be injected directly into the conduction band of the high-k layer (point A has moved to point B). In this situation, the excess electrons need to tunnel through the lower-k portion of the IPD 4, but also through at least a part of the high-k portion of the IPD 4. As a consequence the Variot effect is reduced, hence reducing the parasitic leakage through the IPD. The dotted line III shows the situation with DyScO used for the IPD 4, nearly completely consuming the interfacial SiO—. Only a thin interfacial SiO— layer may remain and on average the energy barrier, shown as the dotted line III, has increased substantially and there is no longer a Variot effect.

Figure 3:
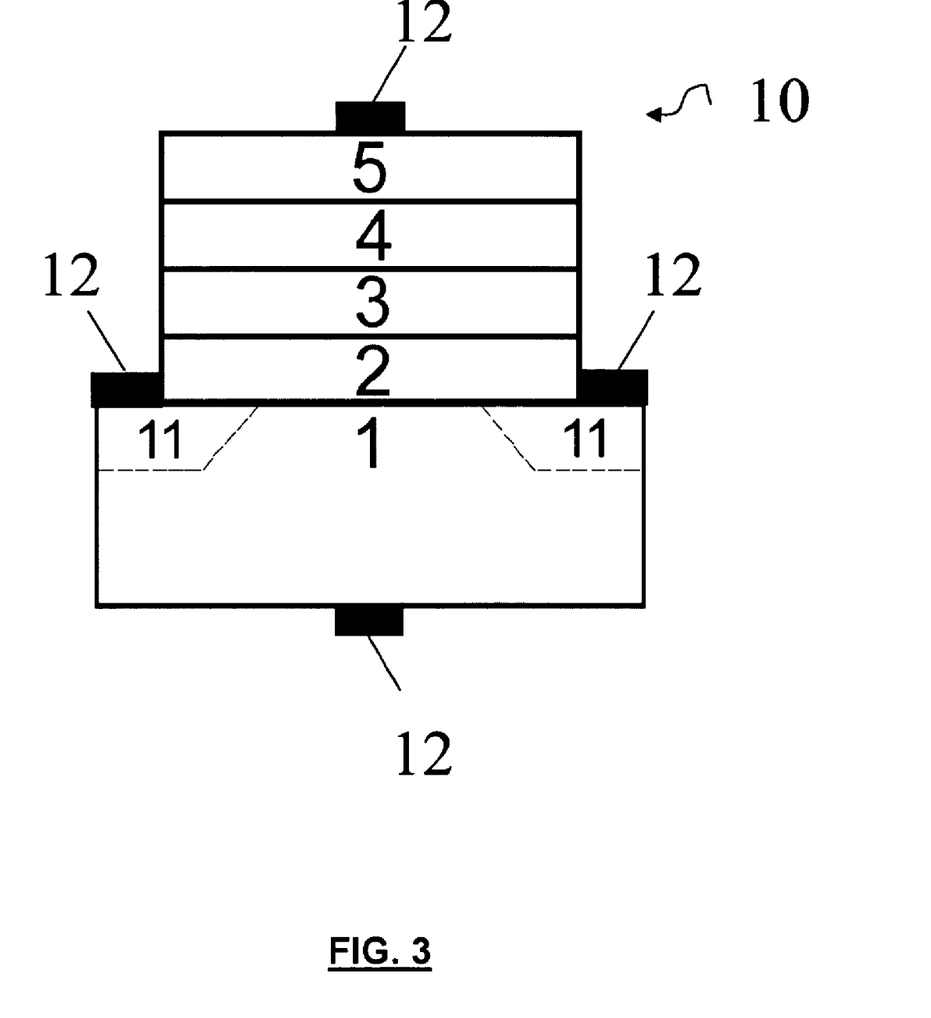
FIG. 3 shows a non-volatile memory device according to a first embodiment.
Figure 4:
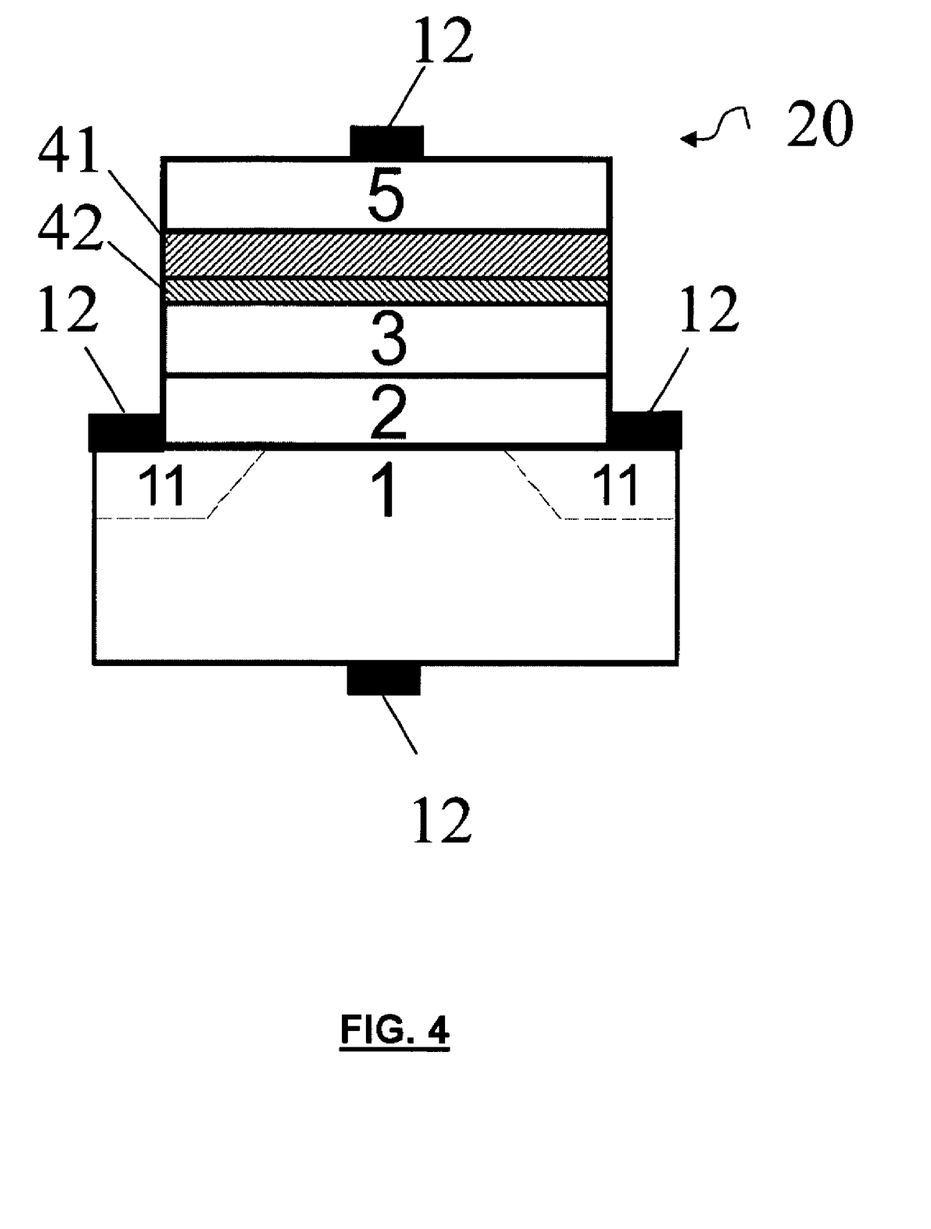
FIG. 4 shows a non-volatile memory device according to a second embodiment.
Figure 5:
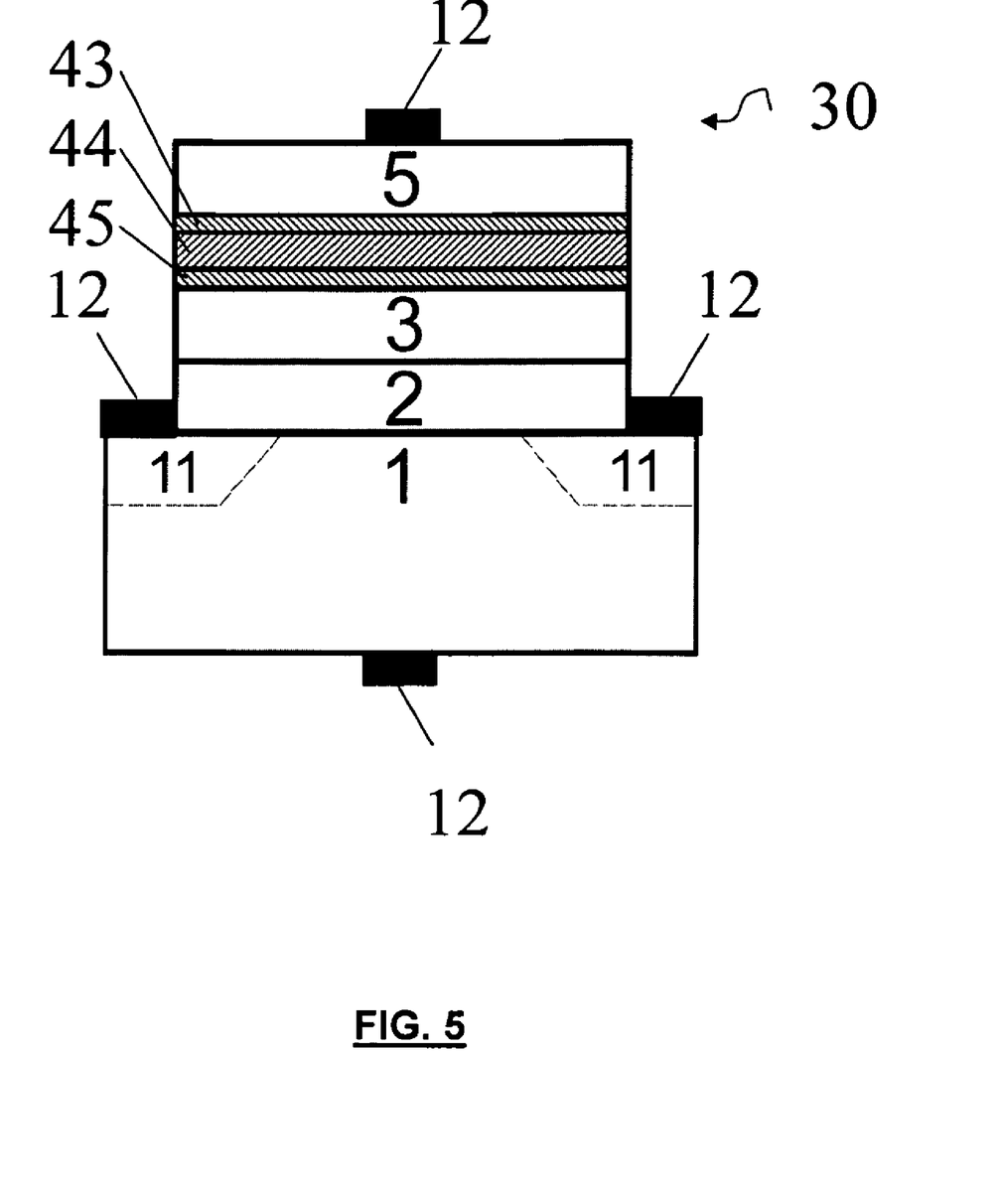
FIG. 5 shows a non-volatile memory device according to a third embodiment.

FIGS. 3-5 show three possible ways in which this property can be exploited in flash memories. In each of these figures, respective non-volatile memory cells 10, 20, 30 are shown, each comprising a substrate with a channel 1 in between two doped regions 11 (source and drain), an insulating layer 2 on top of the channel 1, i.e. the tunnel dielectric stack, a (silicon) charge storage layer 3 on top of the insulating layer 2, an IPD 4 on top of the charge storage layer 3 and a control gate 5 on top of the IPD 4. Each of the layers 2-5 may comprise one or more sub-layers. Contacts 12 are provided at the doped regions 11, at the bottom of the substrate 1 and on top of the control gate 5.

FIG. 3 shows a cell 10 with a single-layer DyScO IPD 4. A suitable thickness range may be, for example, 12-30 nm.

FIG. 4 shows a cell 20 with a dual-layer DyScO/Low-k IPD, where the low-k is e.g. a SiO2, Al2O3, etc, or a combination thereof 42 indicates the DyScO layer and 43 indicates the low-k layer. This embodiment is preferably completed with a high-workfunction metal gate 5. Suitable thickness ranges may be 5-15 nm for the DyScO layer and 2-6 or 2-8 nm for the low-k layer.

FIG. 5 shows a cell 30 with a triple layer D/N/D IPD, where D is DyScO, N is nitride or another relatively low-k material. In the FIG. 43 and 45 indicate the DyScO layers, and 44 indicates the relatively low-k layer. This is a SiO-free stack, scalable to sub 10 nm electrical thickness (e.g. D/N/D=[5-12]/[3-8]/[5-12] nm). The N layer may, for example, be a binary oxide (e.g. dysprosium oxide or scandium oxide) of the DyScO, which can trap charge, hence providing a decoupling of the electric fields in the upper and lower D layers of the stack.

Instead of DyScO, any other SiO-consuming materials known to the person skilled in the art can be used. In some embodiments, said layer 4, 42, 43, 45 of SiO-consuming material comprises any one of the rare earth (RE) materials, e.g one of the lanthanides, including but not limited to La, Y, Pr, Nd, Sm, Eu, Gd, Dy, Er or Yb, and combinations thereof. In some embodiments, said layer comprises oxides of La, Y, Pr, Nd, Sm, Eu, Gd, Dy, Er,Yb, and combinations thereof. Said layer 4, 42, 43, 45 can further comprise a modulator element, such as Al, Hf. or Sc, for example in a ratio of about 50%, for increasing the thermal stability of the layer. Said modulator can be an enhancer element (such as Al), whereby the intermixing, e.g., the reaction between the rare earth material and the silicon oxide interfacial layer, is enhanced. For example, Al can be added to the rare earth material in a ratio Al:(Al+RE) smaller than about 75%. In some embodiments, however, dysprosium scandate is used in view of its excellent insulating and dielectric/Si interface properties.

More in particular, the manufacturing of the devices of FIGS. 3-5 comprises: intentionally or unintentionally forming, on the charge storage layer 3, an upper layer comprising or consisting of SiO—; depositing (preferably immediately) on the upper layer, a rare earth oxide containing (REO) layer 4, 42, 45, either as the blocking/interpoly dielectric itself (FIG. 3) or as a bottom layer of the blocking/interpoly dielectric (FIG. 4-5); depositing on said blocking/interpoly dielectric, at least one layer of a suitable material for forming a control gate electrode; and, after having deposited said material suitable for forming a control gate electrode, performing an annealing step at predetermined conditions for obtaining a reaction, at least partially, between said SiO— containing upper layer and said REO layer, whereby a rare earth silicate (RES) layer is formed.

So according to the present disclosure, there is preferably no annealing step (resulting in RES formation) before having deposited said material suitable for forming a control gate electrode. Preferably, the annealing step is performed immediately after said control gate electrode deposition. Preferably, said annealing step is a post-deposition annealing step, in which a predetermined thermal budget is applied. The manufacturing of the device shown in FIG. 3 includes depositing said material suitable for forming a control gate electrode before performing the annealing step. In case of FIG. 5 the conditions of the annealing step can be chosen such that a lower-k layer 41, e.g. silicon oxide, is grown on top of the higher-k layer 42, e.g., DyScO, during annealing.

The application of the thermal budget preferably comprises subjecting the device for a predetermined period to a temperature higher than (about) 600° C., preferably comprised between (about) 600° C. and (about) 1200° C., more preferably comprised between (about) 600° C. and (about) 1000° C. More preferably, the treatment is performed at a temperature higher than (about) 800° C., preferably comprised between (about) 800° C. and (about) 1200° C., more preferably comprised between (about) 800° C. and (about) 1000° C. In some embodiments, the anneal step is performed in an oxygen-free ambient.

Preferably, said REO layer and said SiO-containing upper layer are provided in a thickness ratio REO:(REO+SiO) between about 0.05 and about 0.4, or between about 0.1 and about 0.4, or between about 0.2 and about 0.35, or between about 0.2 and about 0.3. In at least one embodiment, Dy2O3 is formed on SiO2 or on SiON, then a thickness ratio of about 0.3 would result in the largest intermixing, e.g., the largest consumption of the underlying lower-k layer by the upper high-k layer.

Said at least one REO layer may be deposited by any suitable deposition technique known to those of skill in the art, including but not limited to MOCVD, ALD, AVD or PVD.

If intentionally formed, said SiO-containing layer may be formed or deposited by MOCVD, ALD, AVD or PVD deposition technique. This SiO-containing layer can also be formed by thermal oxidation of a silicon-containing charge storage layer. This SiO-containing layer can also be formed by depositing a SiN layer which is then thermally oxidized to form a SiON layer.

Said control gate electrode 5 may comprise W, Ta, TI, Ru, Pt, Mo, and compounds and combinations thereof, such as TiN, TaN and/or Ru.

A finished memory device according to the present disclosure may still comprise unreacted REO. A REO layer can remain between said RES and an upper layer of the interpoly/blocking dielectric (FIG. 4-5) or the control gate electrode (FIG. 3).

A memory device according to the present disclosure can further comprise a control gate electrode comprising a polySi layer on a metal layer in contact with the interpoly or blocking dielectric.

Preferably, said SiO-containing layer comprises SiO2, SiON, HfSiO, or HfSiON.

Preferably, said substrate 1 comprises a Ge, SiGe, GaAs, and/or InP layer.

The present disclosure is also based on the surprising discovery that there is an optimum ratio REO/(REO+SiO—) for which the effective oxide thickness EOT is the lowest. Indeed, an unexpected observation was the increase of the EOT when departing away from that optimum REO/(REO+SiO—) ratio.

Figure 6:
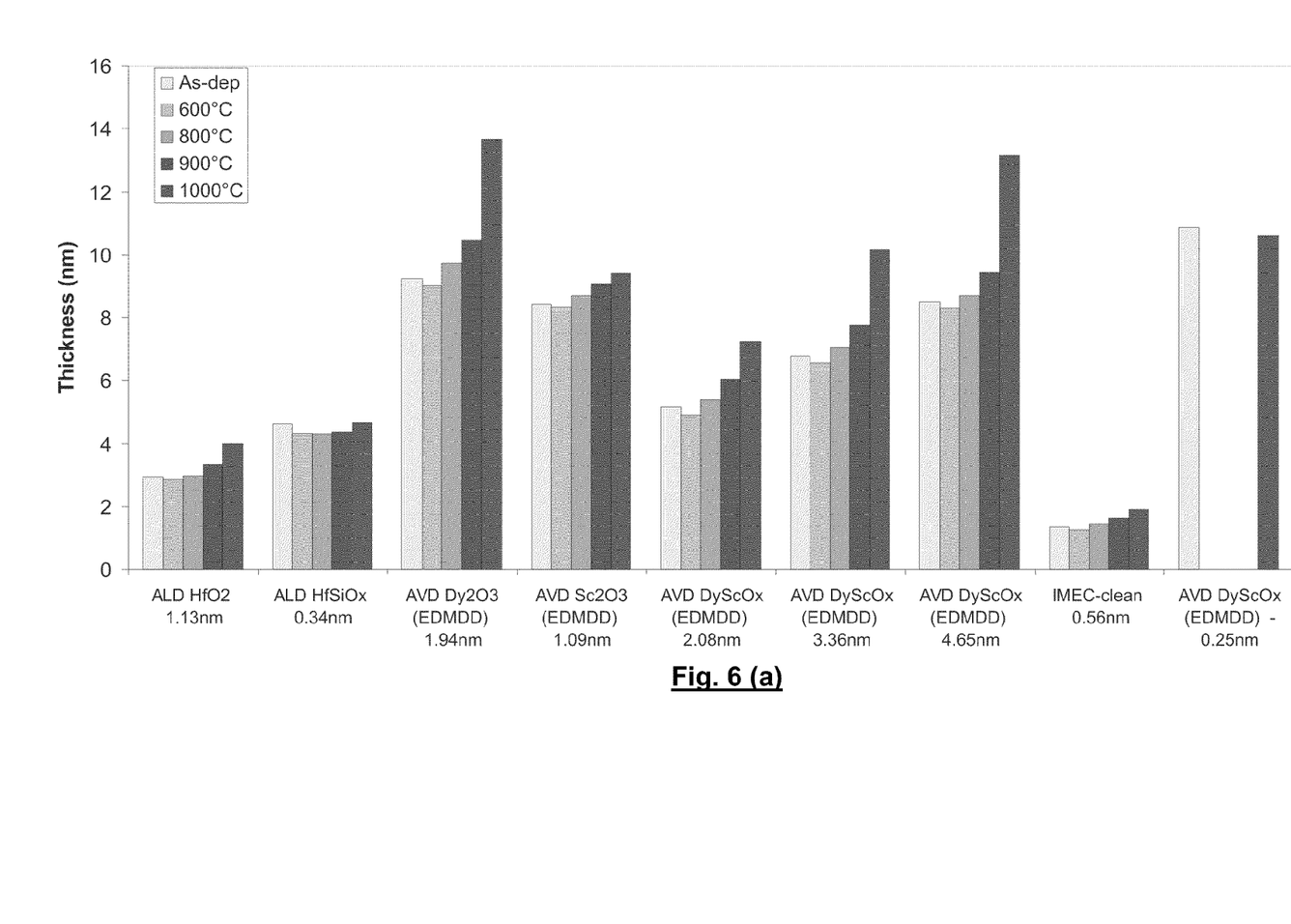

FIG. 6 (a) shows the physical thickness variation of the as deposited interpoly/blocking dielectrics upon anneal at different temperatures. On the X-axis are the ellipsometrically measured film thicknesses for the various blocking/interpoly dielectrics. Various deposition techniques like Atomic layer Deposition (ALD) and Atomic Vapor Deposition (AVD) have been employed. The films have been deposited on an interfacial SiO2x silicon oxide like interface, which is not distinguishable from the ellipsometer result. The deposited bi-layer film stack has been annealed at temperatures approximately between 600° C. and 1000° C. in O2, the later to explicitly stimulate the film thickness increase. The bar graph for IMEC-clean indicates the silicon substrate oxidation as function of anneal treatment studied. The IMEC-clean is a wet cleaning sequence comprising the steps of organic removal with SOM (Sulphuric acid-Ozone mixture), followed by APM (ammonium peroxide) cleaning and diluted HF/HCl with DI (deionized) water rinses in between and Marangoni drying at the end. This substrate only received a clean thereby forming a chemical oxide.

Figure 6B:
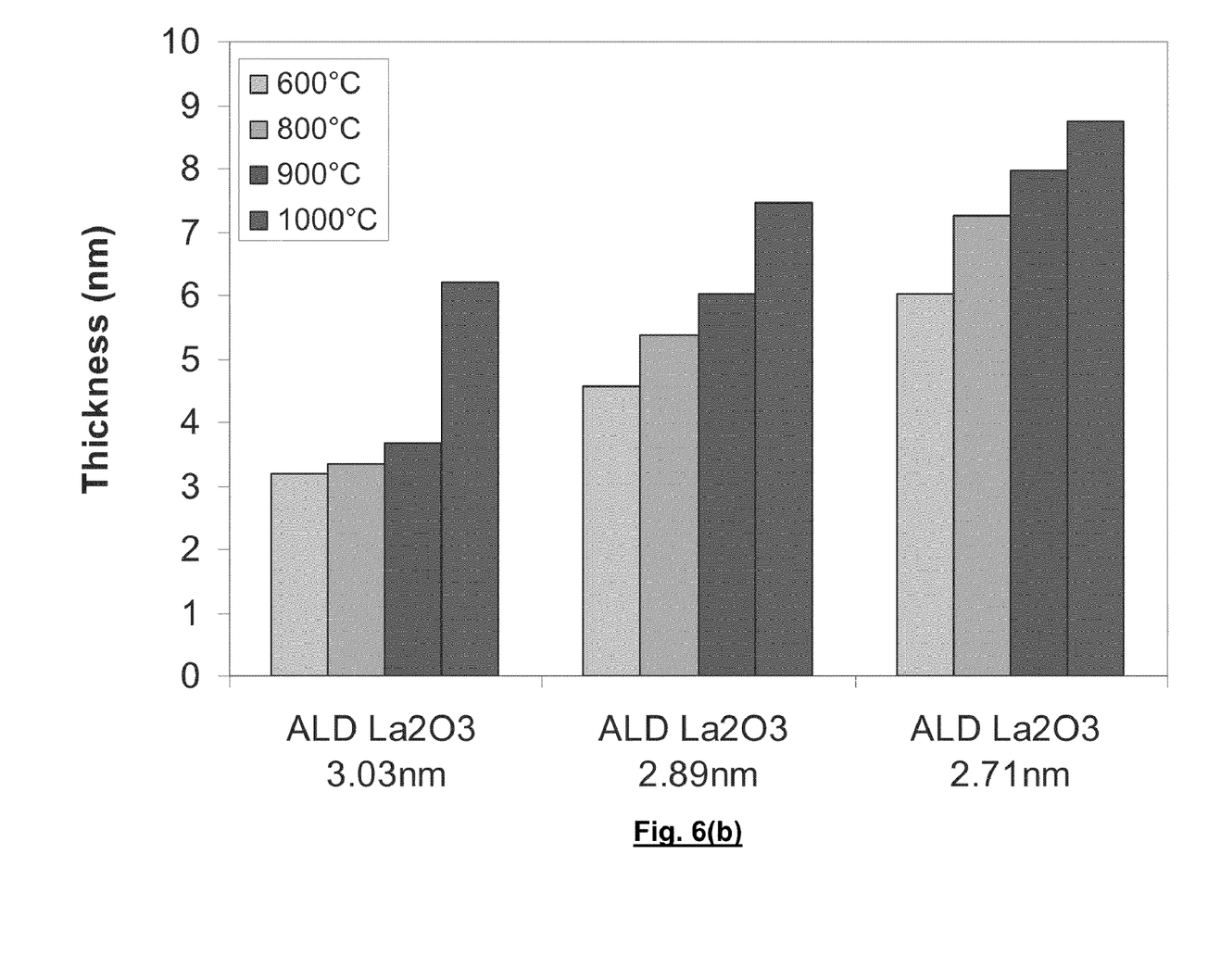

It can be seen that the thickness increase/layer reaction is thermally activated, the larger the thermal budget the larger the physical thickness, and fully deploying at temperatures of approximately 1000° C. or above. However, the degree of reactivity, i.e. the dependency of physical thickness on thermal budget, clearly depends on the species involved, with Dy (and La, see FIG. 1(b)) reacting more substantial than Sc (or even Si) containing films. Moreover, the reactivity of the Dy containing films can be modulated with Sc addition.

FIG. 6 (b) shows the thickness variation of the as deposited ALD La2O3 upon different anneal steps approximately from 600° C. to 1000° C. Similar as for Dy, also for La a clear reactivity and hence physical thickness increase can be observed upon thermal annealing. However, as can be seen from FIG. 6 (b), La2O3 shows a different behavior compared to Dy:
 a reactivity at lower temperatures (about 800° C.),
 moreover, the thickness increase does not depend on the as deposited thickness of the La2O3 layers.

This shows that the (rare earth) element used is one of the parameters that assist in controlling the dielectric properties of the final dielectric layer outcome at the end of the process.

Figure 7:
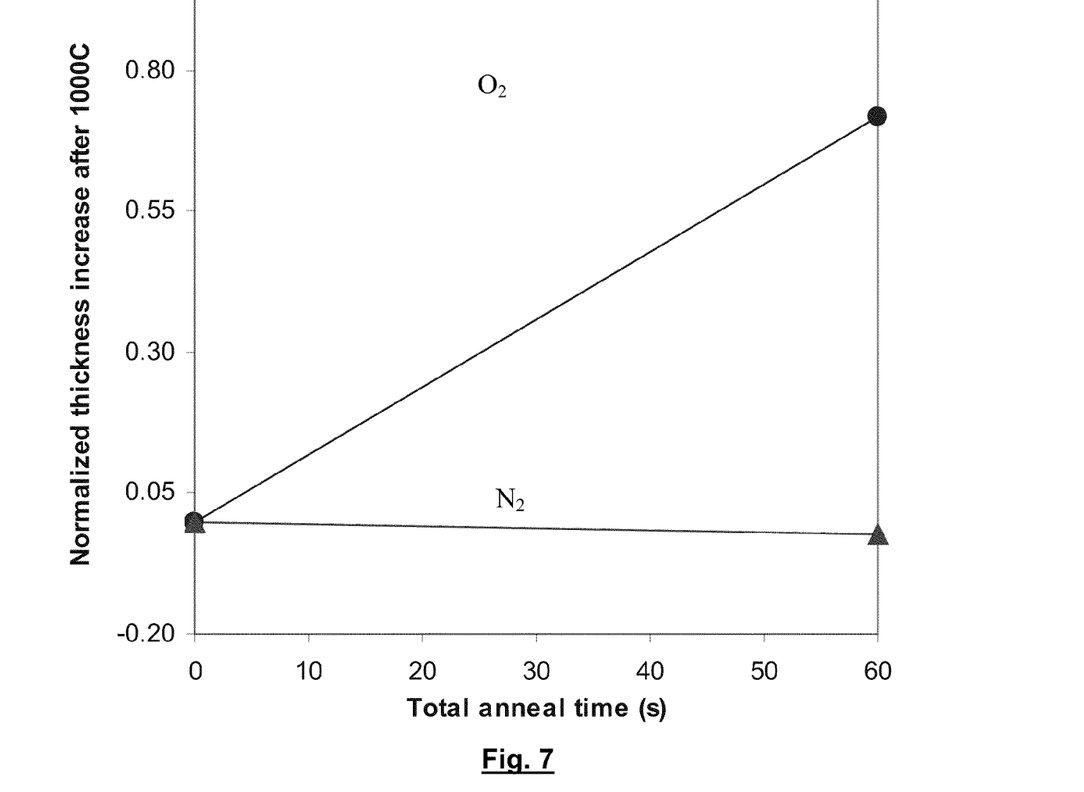
FIG. 7 shows the normalized thickness increase ($t_{annealed} - t_{dep})/t_{dep}$ for DyScOx layers annealed in O2 (●: circle) or N2 (▲: triangle), where $t_{annealed}$ is the layer thickness after a thermal anneal at about 1000° C. and $t_{dep}$ is the as-deposited thickness of the layer.

When annealing a rare earth oxide (REO) layer or stack of layers deposited on top of silicon oxide, silicate formation can be witnessed for example as:
 a) in the absence of an additional oxygen supply: a density decrease of the rare earth (RE) oxide layer because of intermixing of the RE oxide with silicon oxide, but without any significant thickness change of the total dielectric stack, as shown in FIG. 7 (N2 atmosphere);
 b) in the presence of an oxygen source: as a thickness increase caused by a volume expansion due to the incorporation of Si or SiO2, at the reaction front between rare earth film and the silicon oxide film in addition to the regrown or the already present SiO2 before deposition as shown in FIG. 7 (O2 atmosphere).

FIG. 7 shows the normalized thickness increase ($t_{annealed}-t_{dep})/t_{dep}$ for DyScOx layers annealed in O2 (●: circle) or N2 (▲: triangle), where $t_{annealed}$ is the layer thickness after a thermal anneal at about 1000° C. and $t_{dep}$ is the as-deposited thickness of the layer.

Figure 8:
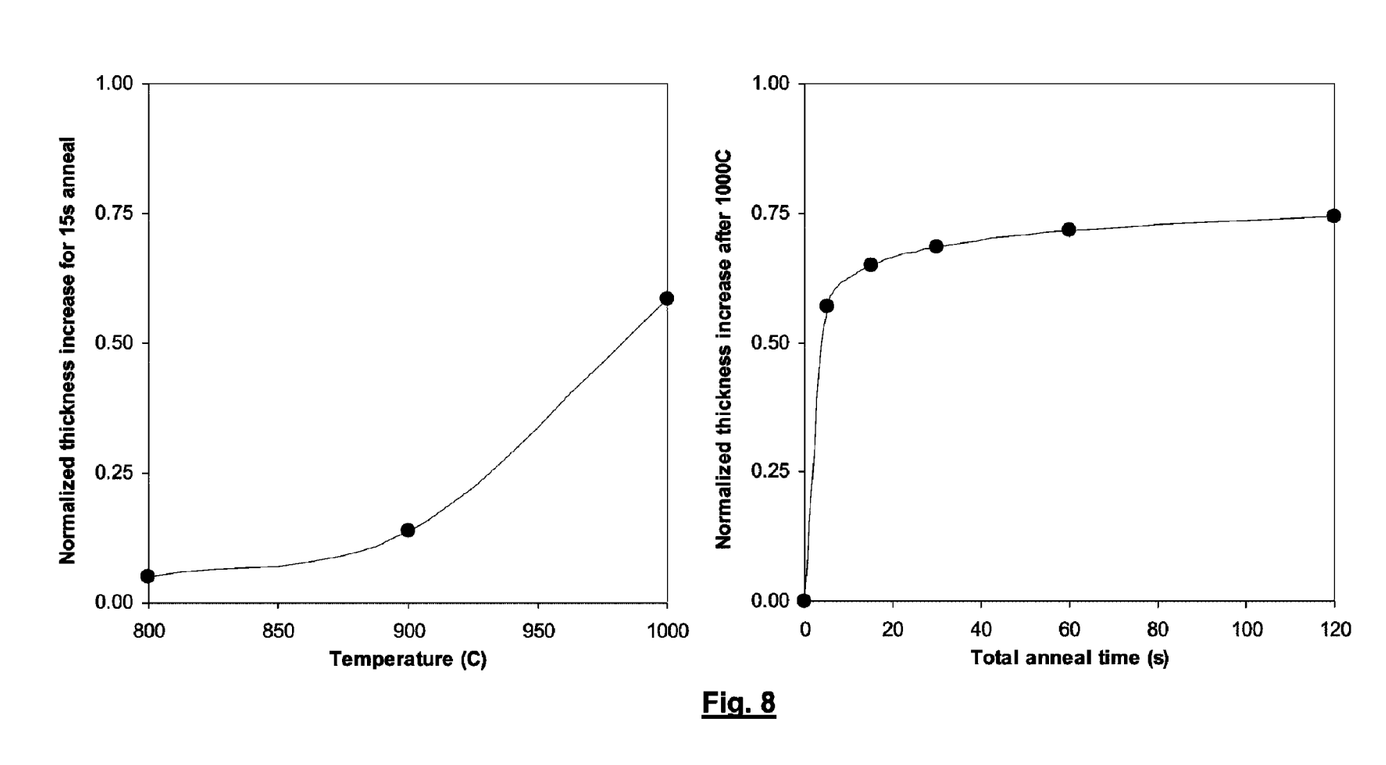
FIG. 8 shows the normalized thickness increase for an about 10 nm DyScOx layer after different thermal treatments (temperature and time)

Besides the ambient used during the anneal step, the silicate formation is function of the thermal budget applied, i.e. depends on time as well as temperature, as shown in FIG. 8.

FIG. 8 shows the normalized thickness increase for an about 10 nm DyScOx layer after different thermal treatments (temperature and time).

For the example of DyScOx, it is clear that the thickness increases more as temperature goes up, especially at temperatures exceeding about 900° C. It can also be seen that the initial silicate formation occurs very fast before stabilizing to an equilibrium value that can be interpreted as the maximum solubility of SiO— in DyScOx.

Figure 9:
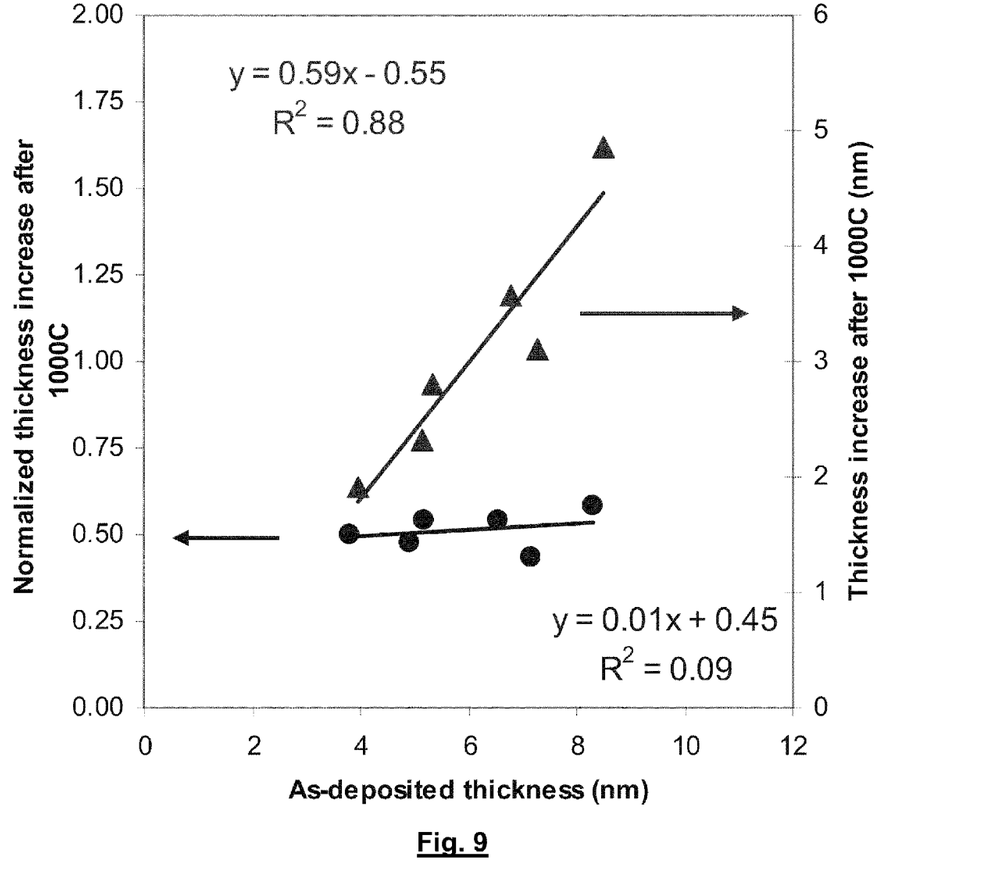
FIG. 9 shows the normalized thickness increase ($t_{annealed} - t_{dep})/t_{dep}$ (●: circle) and absolute thickness increase (▲: triangle) after 1000° C. anneal for a DyScOx layer as function of the as-deposited thickness.

FIG. 9 shows the normalized thickness increase ($t_{annealed}-t_{dep})/t_{dep}$ (●: circle) and absolute thickness increase (▲: triangle) after 1000° C. anneal for a DyScOx layer as function of the as-deposited thickness.

Figure 10:
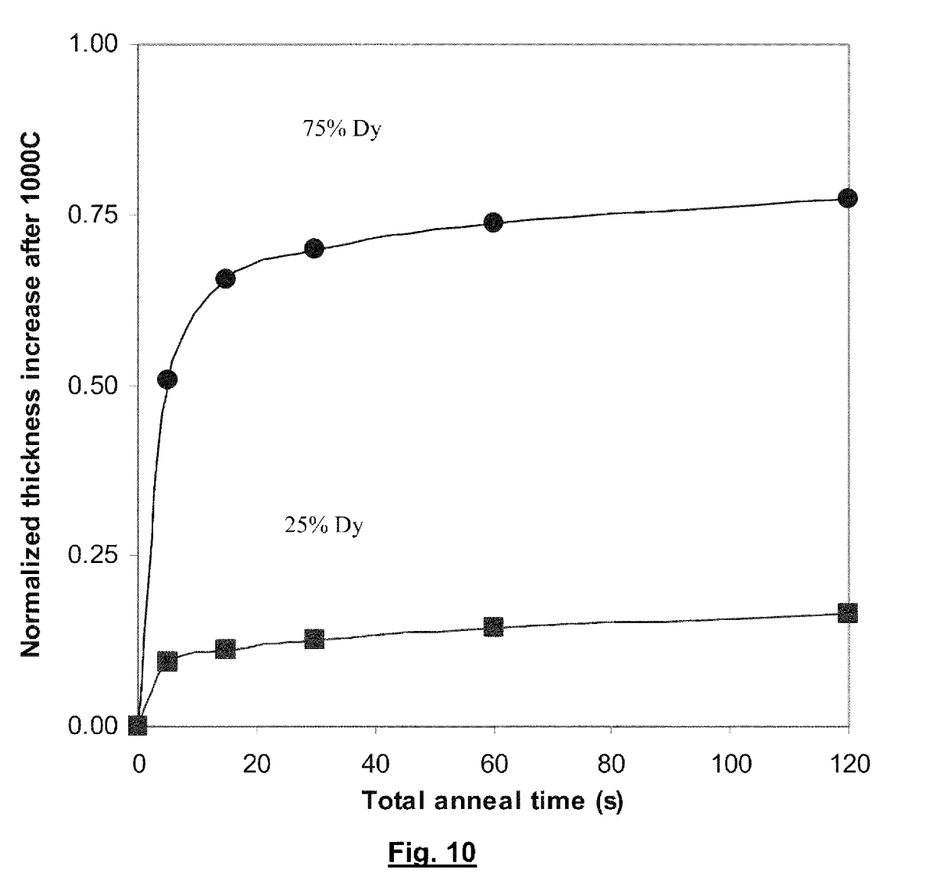
FIG. 10 shows the normalized thickness increase ($t_{annealed} - t_{dep})/t_{dep}$ after a 1000° C. anneal for DyScOx layers as function of the anneal time: Dy-rich (about 75% Dy) (●: circle); Sc-rich (about 25% Dy) (■: square)

FIG. 10 shows the normalized thickness increase ($t_{annealed}-t_{dep})/t_{dep}$ after a 1000° C. anneal for DyScOx layers as function of the anneal time: Dy-rich (about 75% Dy) (●: circle); Sc-rich (about 25% Dy) (■: square).

The maximum amount of SiO— that can be incorporated in the interpoly/blocking dielectric film stack will depend on the amount of rare earth material present (see also FIG. 6 (a)). This is evidenced by:
 a) the relation between the relative thickness increase and the thickness of the as-deposited rare earth oxide, i.e. the thicker the as-deposited layer, the more SiO— can be incorporated as shown in FIG. 9. When considering the relative thickness increase it is clear that the system strives to a certain equilibrium composition, based on the graph below. This equilibrium composition is approximately about 2:1 RE:SiO—. This ratio is determined by the composition of the rare earth layer (see below FIG. 9 for DyScOx) and not by the physical thickness of the layer.
 b) the different behavior of ~10-nm thick DyScOx layers with different composition. The relative thickness increase clearly depends on the composition of the DyScOx layer, where the Dy-rich layer, i.e. the layer that contains the most amount of Dy demonstrates a much larger thickness increase as compared to the Sc-rich layer as shown in FIG. 10. This again demonstrates that the amount of SiO— that can be incorporated in the stack depends on the amount of Dy present.

The behavior described above corresponds to an unlimited supply of oxygen, i.e. where all anneal treatments in a process flow for manufacturing a non-volatile memory device comprising an interpoly/blocking dielectric according to the present invention are done in an oxygen ambient. In that case the system will evolve to a condition where the maximum amount of SiO— can be incorporated.

An influence is also seen from the element that is incorporated (co-deposited) in the interpoly/blocking dielectric.

Figure 11:
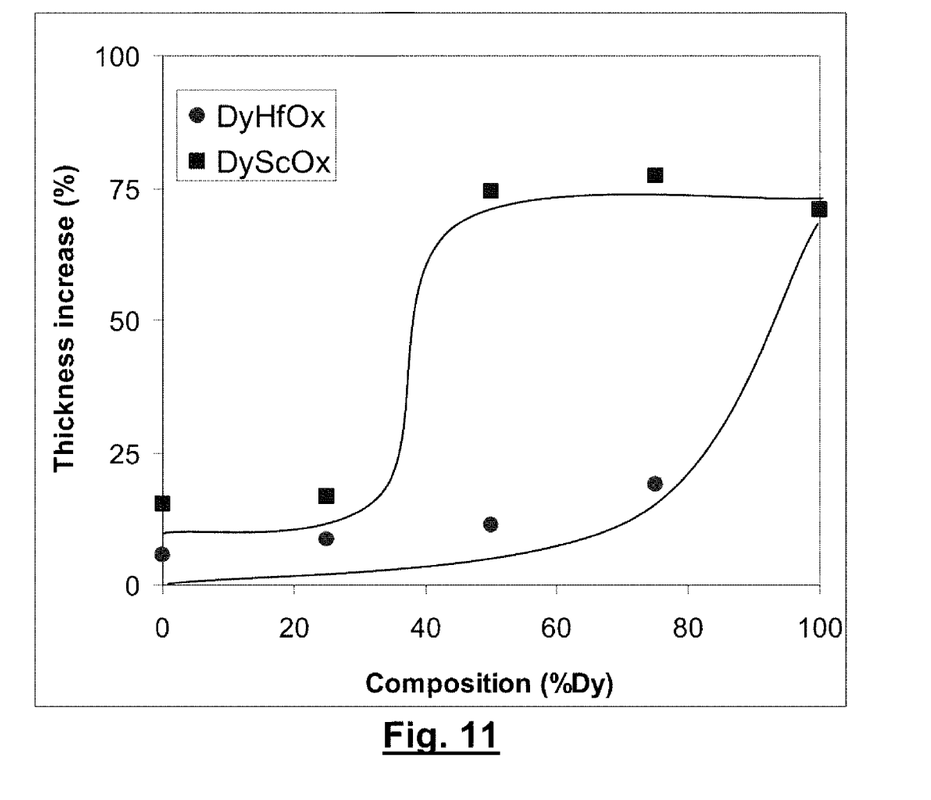
FIG. 11 shows the relative thickness increase (%) as function of the Dy concentration (%) for two different compounds: DyHfOx (■: square) and DyScOx (●: circle).

FIG. 11 shows the relative thickness increase (%) as function of the Dy concentration (%) for two different compounds: DyHfOx (■: square) and DyScOx (●: circle).

Comparing for example DyScOx with DyHfOx layers with varying composition, it is clear that both stacks behave differently as shown in FIG. 11.

Whereas DyScOx layers rather behave as Dy2O3 layers (extensive silicate formation) except for the more Sc-rich layers, incorporation of Hf is clearly seen to limit the silicate formation (less thickness increase since less SiO— incorporation) up to the very Dy-rich DyHfOx layers. The behavior described above corresponds to an unlimited supply of oxygen.

For the case where the anneal is performed without additional oxygen supply, e.g. anneal in N2 or for a layer capped with an oxygen impermeable layer, silicate formation can only occur by mixing of the RE oxide with the SiO— present in the underlying layer. This mixing results in a drop of the density of the RE oxide. This density drop is proportional to the ratio of RE/SiO—. Once all SiO— has been able to react, the system will reach a stable state. The state is stable as long as the system is closed, i.e. the interpoly/blocking dielectric is capped with a metal gate layer on top preventing exposure of the interpoly/blocking dielectric to oxygen and/or no further thermal budgets are applied in an oxygen-containing ambient with a magnitude above the threshold for a given interpoly/blocking dielectric layer formed.

The various nanometer thick high-k dielectric films can be deposited by a range of techniques—preferably chemical vapor deposition like, either as nanolaminates or as co-deposited films. The composition of the film can be controlled. The thickness of SiO— and composition/thickness of the high-k films ought to be selected such that after application of a thermal budget, a suitable EOT is obtained.

The control gate electrode 5 can be formed in a semiconductor material such as polycrystalline silicon. The work function of such a semiconductor control gate electrode can be modified by implanting appropriate dopants. If n-type dopants, such as P or As are implanted, the work function will shift to lower values, e.g., towards the conduction band edge of the semiconductor material. If p-type dopants, such as B, are implanted the work function will shift to higher values, e.g., towards the valence band edge of the semiconductor material. In case of silicon-based gate electrode a low or n-type work function corresponds to a work function of about 4 to about 4.2 eV, whereas a high or p-type work function corresponds to a work function of about 4.9 to about 5.1 eV.

The control gate electrode 5 can be also be formed in a metal or a compound having metallic character, such an alloy of a metal and a semiconductor know as silicide, germanosilicide or germanide depending on which semiconductor material (Si, SiGe, Ge) is used to form the alloy.

The metal compound can be formed by forming a stack of semiconductor material and metal layer, whereby the semiconductor material is fully consumed during the reaction between the semiconductor material and the metal when forming a semiconductor-alloy. Hence the electrode has become a metallic electrode and is known as FUSI: Fully Silicided electrode. The work function of this alloy will depend on its stoichiometry, typically a metal rich alloy (ratio Ni/Si>1), e.g., $Ni_2Si$, $Ni_3Si$ will have a p-type work function, while a silicon-rich alloy (ratio Ni/Si<1), e.g. $NiSi_2$ will have an n-type work function.

The metal or metal compound has a work function of about 4 eV or higher. In some embodiments, the control gate electrode has a work function of this metal selected to be near midgap of crystalline silicon or near the work function of p-type Silicon, e.g., ranging from about 4.5 to about 5.5 eV, The control gate electrode 5 may also be formed as a stack of a thin metal bottom layer with a thicker upper layer of semiconductor material. Such a stack is known as MIPS: Metal Inserted Polysilicon. Typically such a MIPS control gate electrode 5 is being formed by at thin bottom metal layer selected to have a selected work function determining the electrical characteristics of the device. This work function, in some embodiments, is about 4 eV or higher. The thin bottom layer has a thickness of, e.g. 1-10 nm, or 1-3 nm. On top of this bottom metal layer a thicker semiconductor layer, e.g., Si, SiGe, Ge is formed. This upper semiconductor layer has a thickness of e.g. 50-200 nm, or about 100 nm. The upper semiconductor layer is selected to provide a low resistive path, e.g., by highly doping the semiconductor layer, by forming a semiconductor-alloy afterwards, e.g., by a reaction between Si and a metal such as Ti, Co, Ni, thereby forming an alloy known as silicide. In the latter case the control gate electrode is a combination of a FUSI upper electrode and a lower metal electrode.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for manufacturing a non-volatile memory device, comprising:
    providing a substrate comprising a channel between two doped regions;
    applying a first dielectric on top of said channel, said first dielectric having predetermined properties for functioning as a tunnel dielectric;
    applying a charge storage layer on top of said tunnel dielectric, said charge storage layer having predetermined properties for enabling storage of charge in said layer and comprising an upper layer containing silicon dioxide;
    applying a second dielectric, comprising a layer in a siliconoxide consuming material, on top of the upper layer of the charge storage layer on top of said charge storage layer, said second dielectric having predetermined properties for minimizing charge currents through the second dielectric;
    applying a control gate on top of said second dielectric; and
    subjecting the device to a post deposition thermal treatment in which a predetermined thermal budget is applied, such that said siliconoxide consuming material consumes at least part of the upper layer of the charge storage layer.

2. The method according to claim 1, wherein the layer of siliconoxide consuming material forms substantially the whole of the second dielectric.

3. The method according to claim 1, wherein applying a second dielectric further comprises growing a layer of low-k material on top of the layer of siliconoxide consuming material.

4. The method according to claim 3, wherein applying the second dielectric further comprises growing another layer in the siliconoxide consuming material on top of the layer of low-k material.

5. The method according to claim 1, wherein the control gate which is applied on top of the second dielectric is a high-workfunction metal gate.

6. The method according to claim 1, wherein the siliconoxide consuming material comprises a rare earth material.

7. The method according to claim 6, wherein the siliconoxide consuming material is dysprosium scandate, DyScO.

8. The method according to claim 1, wherein applying said predetermined thermal budget comprises subjecting the device to a temperature between 800° C. and 1000° C. for a given time period.

* * * * *